(12) United States Patent
Huang et al.

(10) Patent No.: US 7,397,705 B1
(45) Date of Patent: Jul. 8, 2008

(54) METHOD FOR PROGRAMMING MULTI-LEVEL CELL MEMORY ARRAY

(75) Inventors: Chun Jen Huang, Tainan (TW); Chung Kuang Chen, Pan Chiao (TW); Hsin Yi Ho, HsinChu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/670,382

(22) Filed: Feb. 1, 2007

(51) Int. Cl.
*G11C 16/04* (2006.01)

(52) U.S. Cl. .......................... 365/185.28; 365/185.03; 365/185.24

(58) Field of Classification Search ............. 365/185.28
See application file for complete search history.

(56) References Cited

U.S. PATENT DOCUMENTS

| | | | |
|---|---|---|---|
| 6,011,725 A | 1/2000 | Eitan et al. | |
| 6,320,786 B1 | 11/2001 | Chang et al. | |
| 6,487,114 B2 | 11/2002 | Jong et al. | |
| 6,714,457 B1 | 3/2004 | Hsu et al. | |
| 6,928,001 B2 * | 8/2005 | Avni et al. | 365/185.22 |
| 6,937,511 B2 * | 8/2005 | Hsu et al. | 365/185.03 |
| 6,981,107 B2 | 12/2005 | Lomazzi et al. | |
| 7,133,317 B2 * | 11/2006 | Liao et al. | 365/185.28 |
| 7,136,304 B2 * | 11/2006 | Cohen et al. | 365/185.19 |
| 7,190,614 B2 * | 3/2007 | Wu | 365/185.03 |
| 2006/0146603 A1 * | 7/2006 | Kuo et al. | 365/177 |

\* cited by examiner

*Primary Examiner*—Son L Mai
(74) *Attorney, Agent, or Firm*—Haynes Beffel & Wolfeld LLP

(57) ABSTRACT

A method for operating a charge-trapping multi-level cell ("MLC") memory array comprises programming a first plurality of charge-trapping sites to a preliminary first-level value, programming a second plurality of charge-trapping sites to a preliminary second-level value, and programming a third plurality of charge-trapping sites to a final third-level value using a first programming scheme. Then, the first plurality of charge-trapping sites is programmed to a final first-level value and the second plurality of charge-trapping sites is programmed to a final second-level value using a second programming scheme.

18 Claims, 8 Drawing Sheets

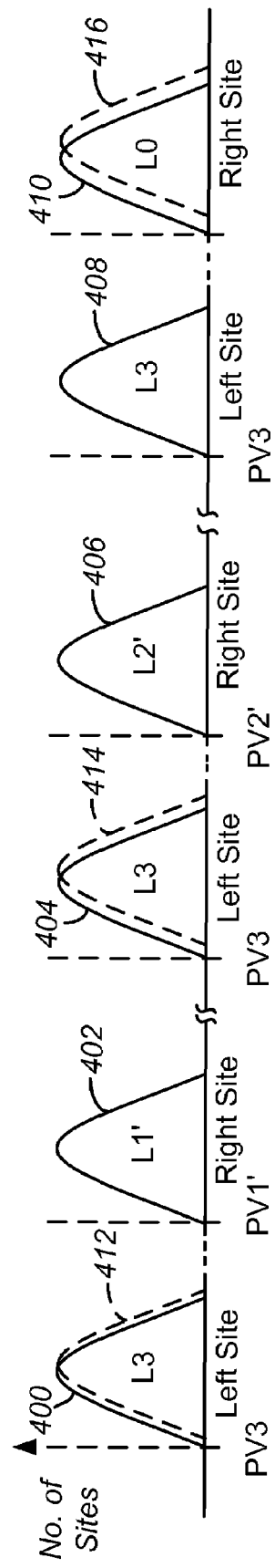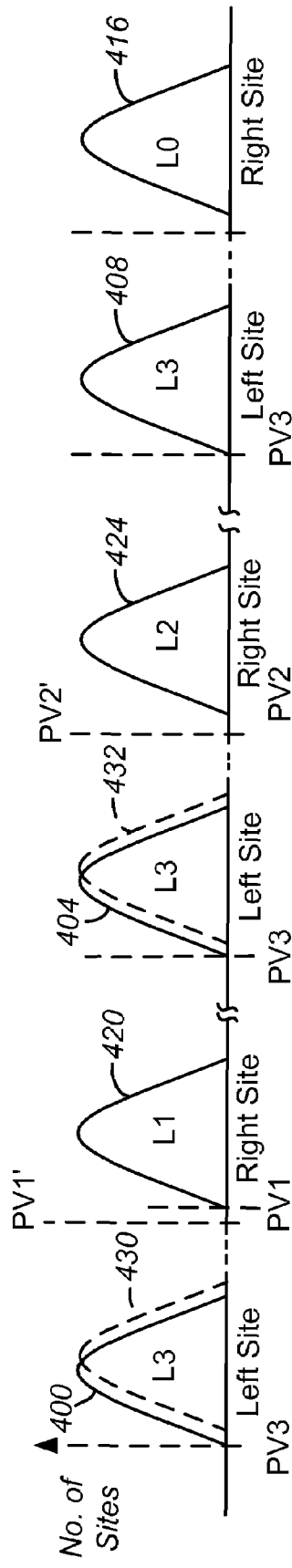
FIG. 4A
FIG. 4B

METHOD FOR PROGRAMMING MULTI-LEVEL CELL MEMORY ARRAY

BACKGROUND OF THE INVENTION

1. Field of the Invention

The present invention relates to memory devices based on multi-level cells ("MLCs"), and more particularly to techniques for programming charge-trapping sites in two-sided charge-trapping cells.

2. Description of Related Art

Conventional flash memory cells store charge on a floating gate (typically doped polysilicon). The stored charge changes the threshold voltage ($V_{th}$) of the memory cell. In a READ operation, a read voltage is applied to the gate of the memory cell, and whether or not the memory cell turns on (e.g. conducts current) indicates the programming state of the memory cell. For example, memory cell that conducts current during a READ operation might be assigned a digital value of "1", and a memory cell that does not conduct current during a READ operation might be assigned a digital value of "0". Charge is added to and removed from the floating gate to program and erase the memory cell, i.e., to change the stored value from 1 to 0.

Another type of memory uses a charge-trapping structure, such as a layer of non-conductive SiN material, rather than the conductive gate material used in floating gate devices. When a charge-trapping cell is programmed, the charge is trapped and does not move through the non-conductive layer. The charge is retained by the charge trapping layer until the cell is erased, retaining the data state without continuously applied electrical power. Charge-trapping cells can be operated as two-sided cells. That is, because the charge does not move through the non-conductive charge trapping layer, charge can be localized on different charge-trapping sites.

FIG. 1A is a Cross Section of a Two-Sided Charge-Trapping Cell 100. The two-sided charge trapping cell stores two values, here represented by a left charge-trapping site 108 and a right charge-trapping site 110. The terms "left" and "right" are used merely for purposes of convenient discussion and illustration. Each charge-trapping site of the cell 100 can be programmed to any one of multiple levels. For example, the left charge-trapping site can be programmed to one of four levels L0, L1, L2, or L3, and the right charge-trapping site can be programmed to one of four levels L0, L1, L2, L3 (see FIG. 1B). The programming value of each charge-trapping site represents a data value, such as 11, 01, 00, and 10; however, these data values are merely exemplary and other data values are alternatively assigned to the programming levels.

The two-sided charge-trapping cell 100 has a gate electrode 102, a first dielectric isolation layer 104, a charge-trapping layer 106 having the first (left) charge-trapping site 108 and the second (right) charge-trapping site 110, and a second dielectric isolation layer 112. Charge-trapping cells are well-known in the art of non-volatile memory devices and a detailed description of the cell structure and materials is therefore omitted.

The two-sided charge-trapping cell 100 is fabricated on a substrate 114, such as a silicon wafer or other semiconductor, and has source/drain regions 116, 118. The cell is programmed by biasing the terminals of the device so as to transfer or remove charge from the charge-trapping sites 108, 110. A data value stored by a charge-trapping site of the cell is read by applying a read voltage to the gate electrode 102 and sensing the current flowing between the source/drain regions 116, 118. Whether a source/drain region is operating as a source or as a drain depends on the bias conditions, so these physical structures will be referred to as "source/drain regions" for purposes of convenient discussion.

The two-sided charge-trapping cell can be programmed to different levels in the first and second charge-trapping sites 108, 110. In other words, the left charge-trapping site 108 is programmed to a different level (data value) than the right charge-trapping site 110. Two-sided charge-trapping cell programming and reading techniques are well-known in the art of charge-trapping memory cell devices and a detailed discussion is therefore omitted.

FIG. 1B shows a memory cell distribution versus READ voltage (Vt) for an MLC memory array having charge-trapping cells. The charge-trapping cell has four levels, L0, which is the erased condition, and programming levels L1, L2, and L3, which are levels where increasing amounts of charge have been transferred to the charge-trapping sites of the charge-trapping cell, increasing Vt for each successive programming level. A site in a charge-trapping cell is typically programmed by programming the cell to a preliminary program-verify value (PV1', PV2', PV3') using a first programming technique, and then programming the cell to a final program-verify value (PV1, PV2, PV3) using a second programming technique. The second programming technique typically provides more precise control of the Vt levels, which results in a more narrow Vt distribution and wider read windows (e.g. $RW_{12}$, $RW_{23}$) between programmed levels. Wide read windows are desirable to facilitate READ operations. The data values 11, 01, 00, 10 are arbitrarily assigned to the programming levels L0, L1, L2, L3 for purposes of illustration and discussion. In a two-sided charge-trapping cell, each charge-trapping site can be operated as a multi-level site. That is, the left charge-trapping site can be programmed to multiple levels independently from the right charge-trapping site, which can also be programmed to multiple levels.

While the right and left charge-trapping sites of a charge-trapping cell (see FIG. 1A, ref. nums. 108, 110) can be independently programmed and read, an interaction arises between the charge-trapping sites that is commonly known as the "neighbor effect." The neighbor effect is basically that the programmed value of one charge-trapping site, and the programming biases applied to achieve that programmed value, can affect the other charge-trapping site, causing a shift in the threshold voltage Vt in the neighboring site. It is desirable to program two-sided charge-rapping memory devices in a manner that reduces the neighbor effect.

SUMMARY OF THE INVENTION

A method for operating a selected cell in an array of charge-trapping multi-level cells ("MLC") is described, where the selected cell includes at least two charge trapping sites, commonly referred to as the left and right charge trapping sites in the memory cell, and each charge trapping site is programmable to at least four threshold levels. The at least four threshold levels represent respectively a first lowest threshold state, second and third intermediate threshold states and a fourth highest threshold state. Programming highest threshold state of charge-trapping sites a final program-verify value (PV3) in the first programming cycle mentioned above, significantly reduces the neighbor effect by preventing biasing in the second program cycle for the highest threshold state.

In an embodiment described, the method includes programming the first charge trapping site, which may be either the left or right site depending on the data being programmed, to a programmed state, such as one of the intermediate threshold states, corresponding to a lower threshold level range using a first programming sequence, and programming the second charge trapping site to a programmed state corresponding to a higher threshold level range, such as the highest threshold state using a second programming s sequence. The programming sequence includes a two-stage process including applying a first programming scheme adapted to setting a threshold voltage for the first charge trapping site at a level below the lower level threshold voltage range, and then applying a second programming scheme adapted to setting the threshold voltage for the first charge trapping site within the lower level threshold voltage range. The second programming sequence applied to the second charge trapping site includes applying a first programming scheme (which may or may not be the same programming scheme as applied first in the first programming sequence) adapted to setting the threshold voltage for the second charge trapping site within the higher level threshold voltage range. The second programming sequence applies a second programming scheme (which may or may not be the same programming scheme as applied second in the first programming sequence), if at all, only if necessary as indicated by a verify cycle after applying the first programming scheme. Thus, embodiments of the method included after applying a programming step for the second charge trapping site with the first programming scheme, determining whether the threshold voltage for the second charge trapping site is within the targeted higher level threshold voltage range. If the threshold voltage is not within the higher level threshold voltage range, then the second programming scheme is applied, adapted to setting a threshold voltage within the higher level threshold voltage range.

Thus, the programming sequence is adapted for applying a two-stage process, where the first stage is not targeted at the final threshold voltage range. The second programming sequence however targets the first stage of the programming sequence to the final threshold voltage range.

In the technology described herein, the first programming scheme comprises applying a sequence of pulses according to a biasing arrangement that causes relatively high levels of charge to be introduced into the trapping sites in each pulse, for fast convergence on the target threshold values; while the second programming scheme comprises applying a sequence of pulses according to a biasing arrangement that causes relatively less charge transfer per pulse, for achieving a tighter distribution of threshold voltages in the final threshold voltage. The threshold values in the trapping sites are verified between pulses in the programming scheme by reading the cells using verify potentials. The verify potentials are designed to be slightly higher than the potentials used for reading the trapping sites during normal operation to provide for a sensing margin as known in the art. Thus, in the techniques described herein, the first programming scheme operates with preliminary verify potentials, below the target, for the trapping sites being programmed to the lower level threshold ranges, and with the final target verify potential for the trapping sites being programmed to the higher level threshold range. The second programming scheme operates with the final target verify potential for all trapping sites. In this manner, trapping sites being programmed to the higher level threshold range are programmed to, or near to, the final target threshold voltage range (within the granularity of threshold voltages achievable) during the first programming scheme, while the trapping sites being programmed to the lower level threshold ranges are programmed to a level below the target range in the first programming scheme. In this manner, the programming of trapping sites being programmed to the highest threshold level is usually not required during the second programming scheme. Because it is found that threshold disturbance called the neighbor bit effect is most pronounced for cells in which one charge trapping site in the cell is programmed to the highest threshold level, substantial reductions in the neighbor bit effect are achieved by reducing or eliminating disturbance caused by the second programming scheme for cells having trapping sites being programmed to the higher level threshold range.

For a programming operation, the trapping sites in an array can be characterized as including a first plurality of charge trapping sites to be programmed to a first intermediate threshold voltage range, a second plurality of charge trapping sites to be programmed to a second intermediate threshold voltage range, and a third plurality of charge trapping sites to be programmed to a highest threshold voltage range. In a particular embodiment, in the first programming scheme, a word line voltage is held constant and a first bit line voltage to the first plurality of charge-trapping sites, a second bit line voltage to the second plurality of charge-trapping sites, and a third bit line voltage to the third plurality of charge-trapping sites are concurrently stepped to transfer charge to the first, second, and third pluralities of charge-trapping sites. In the second programming scheme, a first bit line voltage to the first plurality of charge-trapping sites and at least a second bit line voltage to the second plurality of charge-trapping sites are held constant while a word line voltage to the first plurality of charge-trapping sites and to the second plurality of charge-trapping sites is stepped so as to transfer charge to the first plurality of bits and to the second plurality of bits and to the third plurality of bits if necessary.

In a particular embodiment, after each step of the bit line voltages of the first programming scheme, the first plurality of charge-trapping sites are verified to a preliminary first program-verify level, the second plurality of charge-trapping sites arc verified to a preliminary second program-verify level, and the third plurality of charge-trapping sites are verified to a final third program-verify level. After each step of the word line voltage in the second programming scheme, the first plurality of charge-trapping sites is verified to a final first program-verify level, the second plurality of charge-trapping sites is verified to a final second program-verify level, and the third plurality of charge-trapping sites is verified to a final third program-verify level.

An integrated circuit is also described, having a memory array including two-sided charge-trapping memory cells having charge-trapping sites and control logic including first program-verify logic and second program-verify logic. The first program-verify logic is configured to program a first plurality of charge-trapping sites to a first preliminary programming level, to program a second plurality of charge-trapping sites to a second preliminary programming level, and to program a third plurality of charge-trapping sites to a third final programming level using a first programming scheme. The second program-verify logic is configured to program, after the first program-verify logic operates, the first plurality of charge-trapping sites to a first final programming level and to program the second plurality of charge-trapping sites to a second final programming level using a second programming scheme. In a further embodiment, the second program-verify logic is further configured to verify the third plurality of charge-trapping sites to the third final programming level, and, if a charge-trapping site in the third plurality of charge-trapping sites fails, to program the charge-trapping site to the third final programming level using a second programming scheme.

Other aspects and advantages of the present invention can be seen on review of the drawings, the detailed description and the claims, which follow.

BRIEF DESCRIPTION OF THE DRAWINGS

FIG. 4A shows memory cell distribution versus Vt illustrating the neighbor effect in a two-sided charge-trapping memory array after a first programming sequence according to an embodiment.

FIG. 4B shows the memory distribution versus Vt of the memory array of FIG. 4A after a second programming sequence according to an embodiment.

DETAILED DESCRIPTION

Figure 1A:
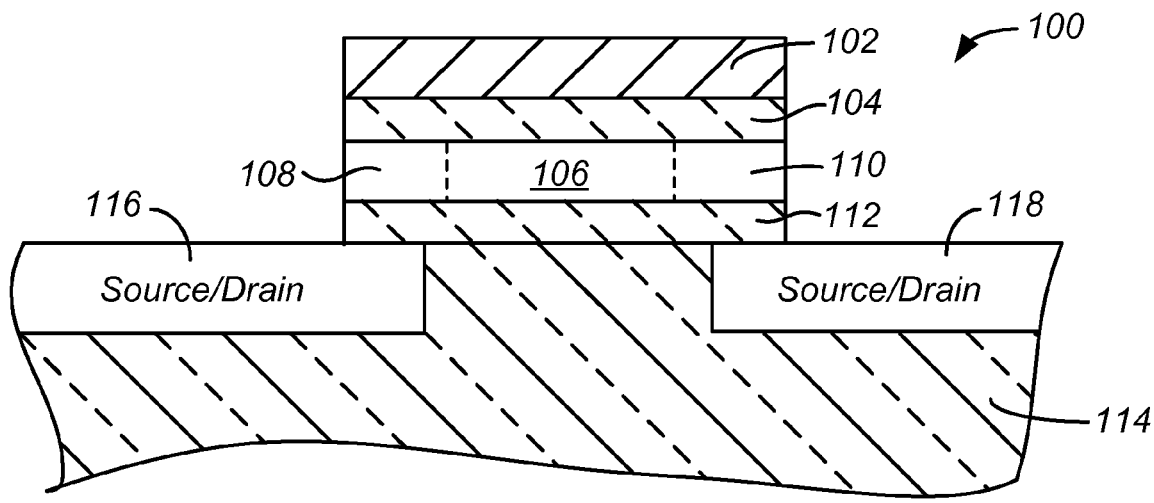
FIG. 1A is a cross section of a two-sided charge-trapping device 100.

A detailed description of techniques for programming two-sided charge-trapping memory arrays is provided with reference to FIGS. 2A-8.

In a two-sided charge-trapping cell, one charge-trapping site is programmed first, and then the other charge-trapping site is programmed. Both charge-trapping sites are not simultaneously programmed because the terminals of the cell are biased differently for each condition. In some cells, the first and second charge-trapping sites are programmed to the same level (where it is understood that the level includes a threshold voltage range for the level). That is, the first charge-trapping site is programmed to a level, and the second charge-trapping site is programmed to the same level. Frequently, the first and second charge-trapping sites are programmed to different levels, and one site will be programmed to a higher level than the other. This means that more charge is transferred to one portion of the charge-trapping layer than the other portion of the charge-trapping layer. When sites of the charge-trapping layer are programmed to different levels (data values), the neighbor effect is increased.

The neighbor effect is caused by the local electron traps in the charge-trapping layer (typically SiN). The charge trapped in one site of the charge-trapping layer affects the threshold voltage in the other site. The neighbor effect is of particular concern in short-gate devices because the first and second charge-trapping sites are closer to each other than in devices with wider gates.

When programming a memory array having two-sided charge-trapping cells, in some cases the first charge-trapping site will be programmed to a higher level (i.e. more charge is transferred to the site) than the second charge-trapping site. In other cases, the first charge-trapping site is programmed to a lower level than the second charge-trapping site. The neighbor effect increases with increasing difference in trapped charge between the first and second sites, and with decreasing proximity between the first and second sites. That is, the neighbor effect will be greatest in a two-sided charge-trapping cell with one site at the lowest level and the other site at the highest level.

Similarly, higher programming levels (higher Vth) creates a more pronounced neighbor effect. For example, in a two-sided charge-trapping cell where each site can have four programming levels (L0, L1, L2, and L3, with L3 being the highest programming level (most charge trapped)), a charge-trapping site of a two-sided charge-rapping cell programmed to L3 will have the most neighbor effect on the adjacent charge-trapping site of the two-sided charge-trapping cell.

For efficient programming of a charge-trapping memory array in the embodiment described, a first programming scheme is used to quickly program the charge-trapping cells in the memory array to preliminary program-verify (PV') values which are below the target threshold range for the programmed state, and then a second programming scheme, which provides finer adjustment of Vt, is used to program the charge-trapping cells to their final program verify (PV) values to ensure that the cell as a threshold within the target threshold range for the programmed state. For example, in the first programming scheme preferably in both the first and second sequences, the word line bias is held constant and the drain bias is stepped, and in the second programming scheme preferably in both the first and second sequences, the bit line voltage is held constant according to the desired programming level of the charge-trapping site and the word line bias is stepped. If the desired programming level is not achieved, the bit line voltage(s) are changed, and the word line bias is stepped again. Typically, the programming level of each cell is verified after each voltage step in either scheme, or alternatively the programming level of each cell is verified prior to applying a charge pulse. Generally, the programming level is verified between each pulse. If a cell passes program-verify, it is masked from further programming.

Similar techniques are used to program each site of a two-sided charge trapping cell. In a two-sided charge-trapping memory cell, the left and right sites are programmed at a different times because they share bit lines and word lines, and with different biasing arrangements. The timing of the programming of the two sides is arbitrary, and thus may or may not be sequential.

Figure 2A:
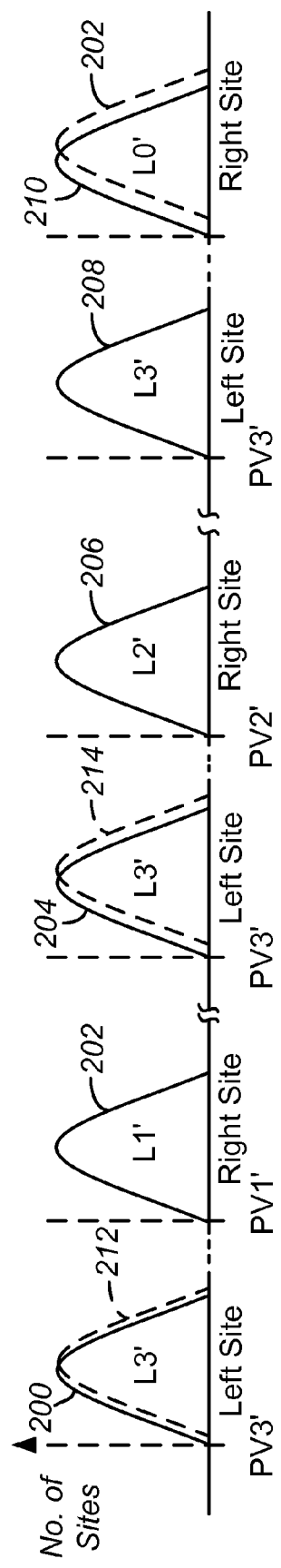
FIG. 2A shows memory cell distribution versus Vt illustrating the neighbor effect in a conventionally programmed two-sided charge-trapping memory array after a first programming scheme.

FIG. 2A shows memory cell distribution versus Vt illustrating the neighbor effect in a conventionally programmed two-sided charge-rapping memory array after a first programming scheme. Distributions 200, 204, 208 represent the Vt's of first-programmed site in two-sided charge-trapping cells of the memory array after the first programming scheme has brought them to a preliminary third programming level PV3'. Level 3 distributions are illustrated because those cases are the ones that cause the most pronounced neighbor effect.

Neighbor effects also arise from sites programmed at L2 (for neighboring sites at L1 or L0), and from sites programmed at L1 (for neighboring sites at L0).

Distributions 202, 206, 210 represent the Vt's of second-programmed sites in the two-sided charge-trapping cells after the first programming scheme has brought them to a preliminary first programming level PV1', preliminary second programming level PV2' and preliminary initial (erased) level L0' respectively. The dashed lines 212, 214, 216 represent the new Vt distributions of charge-trapping sites in the two-sided charge-rapping cells after programming the neighboring sites of the two-sided charge-trapping cells. The shift from the original distributions 200, 204, 210 shows the neighbor effect after the first programming scheme. Since the third level is programmed first, programming the neighboring site to the first level 202 shifts the Vt distributions of the first-programmed sites from the original distribution 200 to a shifted distribution 212. Similarly, programming the neighboring site to the second level 206 shifts the Vt distribution of the first-programmed sites from the original distribution 204 to a shifted distribution 214 that is even more of a shift than when the neighboring charge-trapping site is programmed to the first level. Neighboring sites that are programmed to the lowest level (e.g. the erased state, where no charge is added during programming) do not affect the level three programming, but are shifted 216 by the neighboring level three sites 208.

Figure 2B:
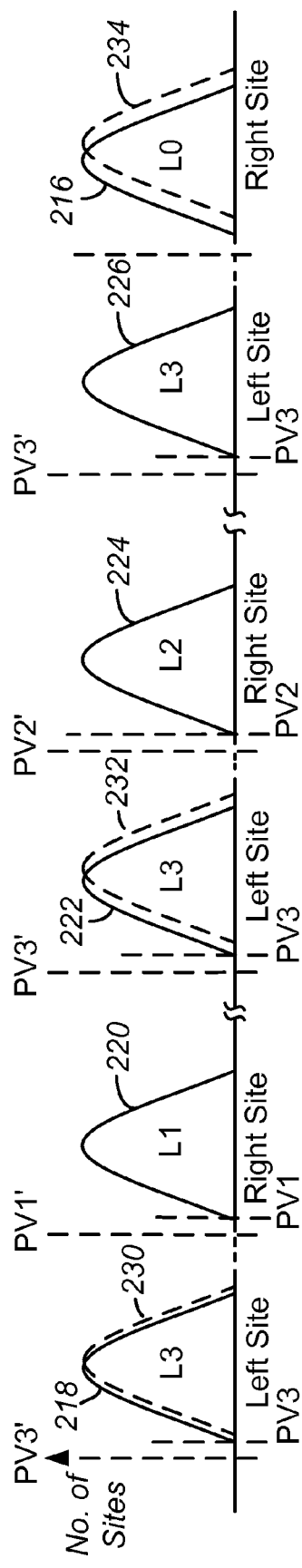
FIG. 2B shows the memory cell distribution versus Vt of the memory array of FIG. 2A after a second programming scheme.

FIG. 2B shows the memory cell distribution versus Vt of the memory array of FIG. 2A after a second programming scheme. In the second programming scheme, the sites are programmed to their final values, PV1, PV2, or PV3, or left in the initial (erased) stage L0. The final PV values are higher than the preliminary values PV1', PV2', PV3' indicating that additional charge is added to the L1, L2, and L3 sites during the second programming scheme.

Distributions 218, 222, 226 represent the Vt's of first-programmed sites in two-sided charge-trapping cells of the memory array after the second programming scheme has brought them to a final third programming level PV3. Distributions 220, 224 represent the Vt's of second-programmed sites in the two-sided charge-trapping cells after the second programming scheme has brought them to a final first programming level PV1 and final second programming level PV2. The original level zero L0 is not adjusted; however, the distribution of L0 sites 216 is affected by the final L3 programming of the adjacent sites 226, and shifts to distribution 234. The dashed lines 230, 232, 234 represent the new Vt distribution of sites in the two-sided charge-trapping cells after programming the sites of the two-sided charge-trapping cells to their final value.

Figure 1B:
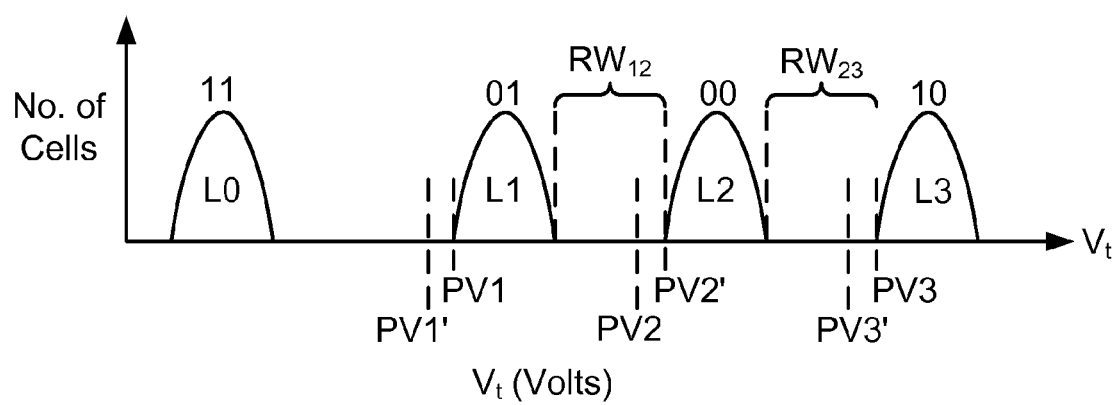
FIG. 1B shows a memory cell distribution versus Vt for a conventional MLC memory array.

The shift from the original distributions 218, 222 of the level three sites shows the neighbor effect after the second programming scheme. Comparing FIG. 2B with FIG. 2A, it is seen that the second programming scheme increases the neighbor effect. The neighbor effect requires a memory system to be designed for a wider range of thresholds for each level, and reduces the margins (read windows, see FIG. 1B, $RW_{12}$, $RW_{23}$) between the threshold values.

Figure 3A:
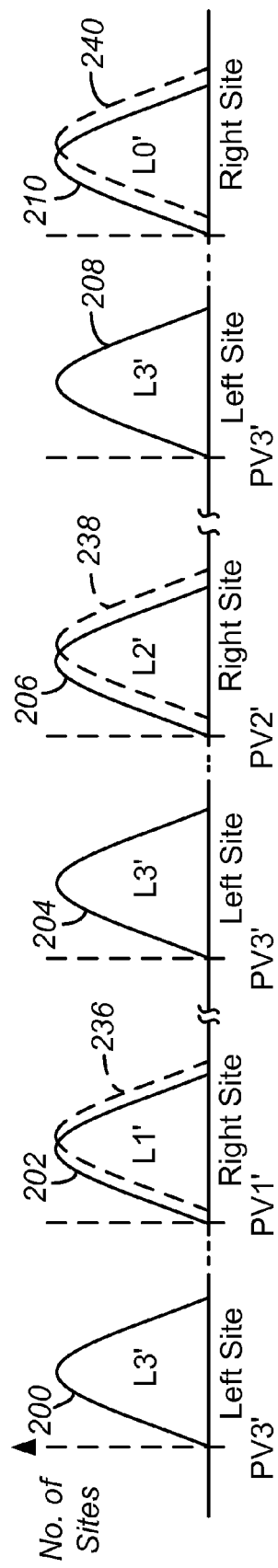
FIG. 3A shows memory cell distribution versus Vt illustrating the neighbor effect in a conventionally programmed two-sided charge-trapping memory array after another first programming scheme.

FIG. 3A shows memory cell distribution versus Vt illustrating the neighbor effect in a conventionally programmed two-sided charge-trapping memory array after another first programming scheme. In this example, the second site of two-sided charge-trapping cells are programmed to the third level after the first site has been programmed to a lower level. Thus, the later-programmed neighboring site pulls the Vt distribution of the earlier-programmed site.

Distributions 202, 206, 210 represent the Vt's of first-programmed sites in the two-sided charge-trapping cells after the first programming scheme has brought them to a preliminary first programming level PV1' and preliminary second programming level PV2'. The un-programmed (L0) sites are at a preliminary level L0'. Distributions 200, 204, 208 represent the Vt's of second-programmed sites in the two-sided charge-trapping cells of the memory array after the first programming scheme has brought them to a preliminary third programming level PV3'. The dashed lines 236, 238, 240 represent the new Vt distributions of the first-programmed sites in the two-sided charge-trapping cells after programming the second-programmed sites of the memory cells to the third preliminary programming level. The third preliminary level is programmed after the first site in the two-sided charge-trapping cells is programmed, and the original Vt distributions of the first-programmed sites 202, 206, 210 are shifted to distributions 236, 338, 240.

Figure 3B:
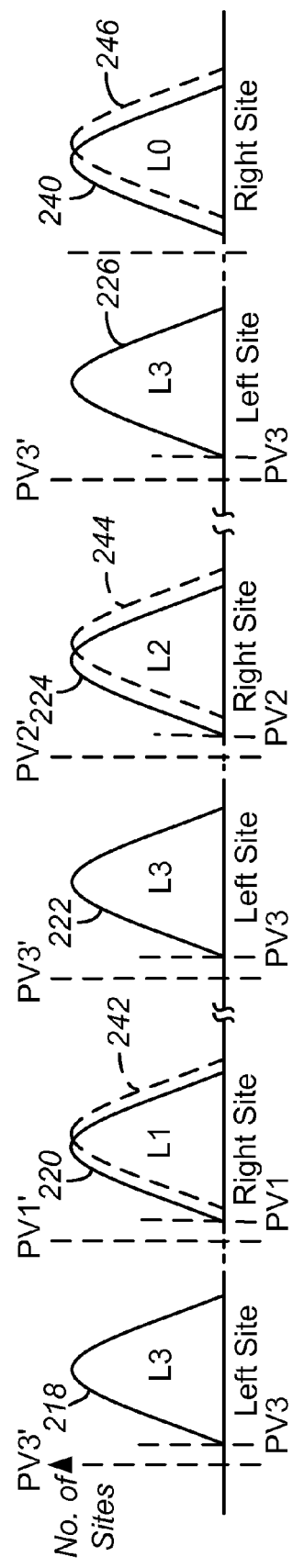
FIG. 3B shows the memory cell distribution versus Vt of the memory array of FIG. 3A after a second programming scheme.

FIG. 3B shows the memory cell distribution versus Vt of the memory array of FIG. 3A after a second programming scheme. In the second programming scheme, the sites are programmed to their final values, PV1, PV2, or PV3. The final values are higher than the preliminary values PV1', PV2', PV3', indicating that additional charge is added to the L1, L2 and L3 sites during the second programming scheme.

Distributions 220, 224, 240 represent the Vt's of first-programmed charge-trapping sites in two-sided charge-trapping cells of the memory array after the second programming scheme has brought them to their final programming levels PV1, PV2. The un-programmed (previously erased) sites 240 remain at level 0 from the first programming scheme. Distributions 218, 222, 226 represent the Vt's of second-programmed sites in the two-sided charge-trapping cells after the second programming scheme has brought them to a final third programming level PV3. The dashed lines 242, 244, 246 represent the new Vt distributions of the first-programmed sites in the two-sided charge-trapping cells after programming the neighboring sites of the cells to their final PV3 level.

The shift from the distributions 220, 224, 240 of the level 1, level 2 and level 0 bits shows the neighbor effect after the second programming scheme has brought the second-programmed sites to level 3. Comparing FIG. 3B with FIG. 3A, it is seen that the second programming scheme increases the neighbor effect. The neighbor effect requires a memory system to be designed for a wider range of thresholds for each level, and reduces the margins (read windows, see FIG. 1B, $RW_{12}$, $RW_{23}$) between the threshold values.

FIG. 4A shows memory cell distribution versus Vt illustrating the neighbor effect in a two-sided charge-trapping memory array after a first programming sequence according to an embodiment. Distributions 400, 404, 408 represent the Vt's of first-programmed sites in two-sided charge-trapping cells of the memory array after the first programming scheme has brought them to a third programming level PV3. Distributions 402, 406, 410 represent the Vt's of second-programmed sites and level 0 sites in the two-sided charge-trapping cells after the first programming scheme has brought them to a preliminary first programming level PV1' and preliminary second programming level PV2'. The initial (erased) level L0' sites 410 are not programmed, but the Vt distribution of the L0' sites 416 is shifted by the neighboring L3 sites 408. The dashed lines 412, 414, 416 represent the new Vt distributions of programmed sites in the two-sided charge-trapping cells after programming the neighboring sites of the charge-trapping cells. The shift from the original distributions 400, 404, 410 shows the neighbor effect after the first programming scheme.

Since the third level is programmed first, programming the neighboring charge-trapping site to the first level 402 shifts the Vt distribution of the first-programmed L3 site from the original distribution 400 to a shifted distribution 412. Similarly, programming the neighboring site to the second level 406 shifts the Vt distribution of the first-programmed L3 site from the original distribution 404 to a shifted distribution 414 that is even more of a shift than when the neighboring site is programmed to L1 (compare 400, 412). Neighboring sites that are programmed to the lowest level (e.g. the erased state, where no charge is added during programming) do not affect the level three Vt distribution 408, but are shifted 416 by the neighboring level three sites 408.

FIG. 4B shows the memory distribution versus Vt of the memory array of FIG. 4A after a second programming sequence according to an embodiment. In the second programming scheme, the L1 and L2 charge-trapping sites are programmed to their final PV values, PV1 and PV2. The L3 sites were programmed to their final value PV3 during the first programming sequence of FIG. 4A. The final PV values for L1 and L2 are higher than the preliminary values PV1', PV2', indicating that additional charge is added to the L1 and L2 sites during the second programming scheme.

Distributions 400, 404, 408 represent the Vt's of first-programmed charge-trapping sites in two-sided charge-trapping cells of the memory array after the second programming scheme. The distributions are the same as in FIG. 4A because the final programming level PV3 was used during the first programming scheme of FIG. 4A, instead of a preliminary L3 level PV3' (compare FIGS. 2A, 2B), and no additional charge is added to the L3 sites during the second programming scheme. Distributions 420, 424, 416 represent the Vt's of second-programmed sites in the two-sided charge-trapping cells after the second programming scheme has brought them to a final first programming level PV1 and final second programming level PV2. The dashed lines 430, 432 represent the new Vt distribution of sites in the two-sided charge-trapping cells after programming the neighboring sites of the charge-trapping cells to their final value. The level 0 distribution 416 is the same as the shifted Vt distribution 416 in FIG. 4A after the first programming scheme, since no additional charge is added to the L3 sites 408 in the second programming scheme.

Comparing FIG. 4B with FIG. 2B, it is seen that the programming technique of FIGS. 4A and 4B provide a reduced neighbor effect compared to conventional programming techniques. This allows a memory system according to an embodiment to be designed for a narrower range of thresholds for each level, and increases the margins (read windows) between the threshold levels.

Figure 5A:
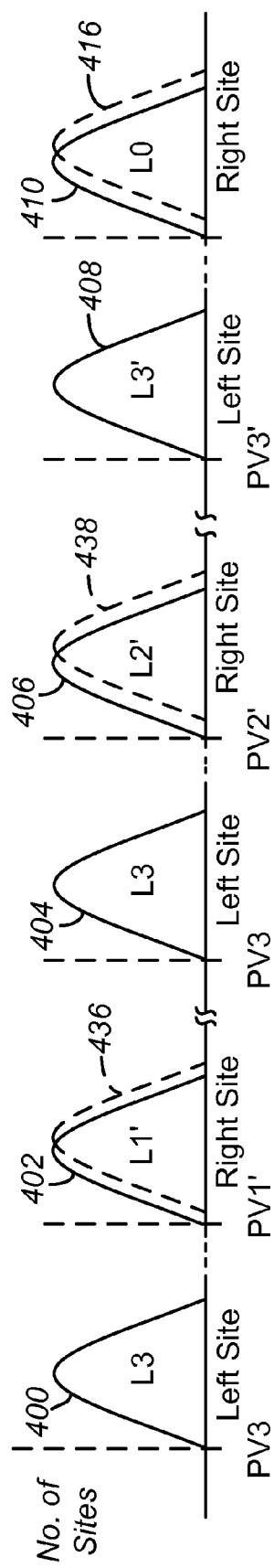
FIG. 5A shows memory cell distribution versus Vt illustrating the neighbor effect in a two-sided charge-trapping memory array after a first programming sequence according to another embodiment.

FIG. 5A shows memory cell distribution versus Vt illustrating the neighbor effect in a two-sided charge-trapping memory array after a first programming sequence according to another embodiment. In this example, the second-programmed site of two-sided charge-trapping cells are programmed to the third level after the first-programmed charge-trapping sites 400, 404, 408 have been programmed to a lower level (e.g. L1' 402 or L2' 406). Thus, the second-programmed neighboring L3 charge-trapping sites pull the Vt distributions of the first-programmed sites.

Distributions 402, 406 represent the Vt's of first-programmed sites in the two-sided charge-trapping cells after the first programming scheme has brought them to a preliminary first programming level PV1' and preliminary second programming level PV2'. The initial (erased) level L0' sites 410 are not programmed, but the neighboring L3 sites 408 shift the level 0 sites to Vt distribution 416. Distributions 400, 404, 408 represent the Vt's of second-programmed L3 sites in the two-sided charge-trapping cells of the memory array after the first programming scheme has brought them to a third programming level PV3. The dashed lines 436, 438, 416 represent the new Vt distribution of the first-programmed and L0 sites in the two-sided charge-trapping cells after programming the second-programmed sites of the cells to the third programming level L3. The shift from the original distributions shows the neighbor effect after the first programming scheme.

Figure 5B:
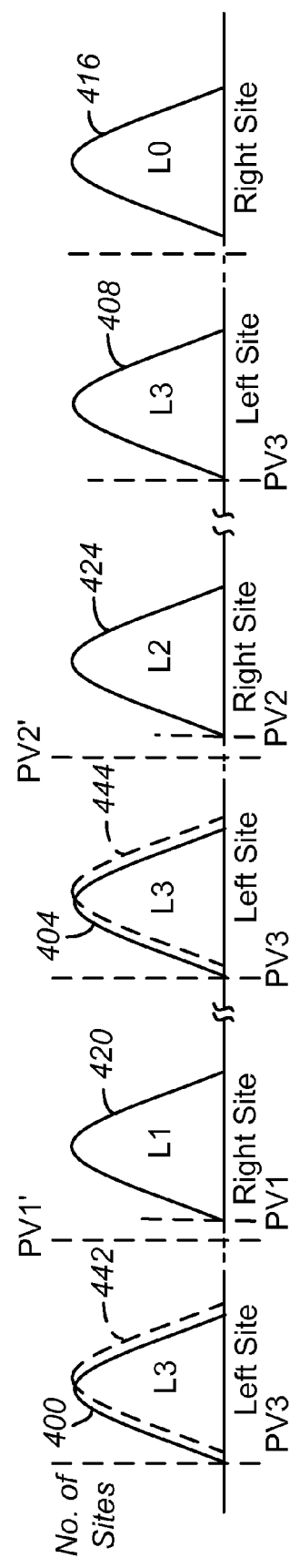
FIG. 5B shows the memory distribution versus Vt of the memory array of FIG. 5A after a second programming sequence according to another embodiment.

FIG. 5B shows the memory distribution versus Vt of the memory array of FIG. 5A after a second programming sequence according to another embodiment. In the second programming scheme, the L1 and L2 sites are programmed to their final values, PV1 and PV2. The level 3 sites are not further programmed during the second programming scheme. The final PV values PV1, PV2 are higher than the preliminary values PV1', PV2', indicating that additional charge is added to the L1 and L2 sites during the second programming scheme. This additional charge added to the L1 and L2 sites during the second programming scheme slightly pulls the Vt distributions of the L3 sites. Namely, distribution 400 is pulled to distribution 442 by the neighboring L1 sites 420, and distribution 404 is pulled to distribution 444 by the neighboring L2 sites 444.

Distributions 420, 424, 416 represent the Vt's of first-programmed sites in two-sided charge-trapping cells of the memory array after the second programming scheme has brought them to their final programming levels. The shift from the original distributions 400, 404 of the level 3 sites shows the neighbor effect after the second programming scheme has brought the second-programmed sites to levels L1 and L2. Comparing FIG. 5B with FIG. 3B, it is seen that the exemplary programming technique of FIGS. 5A and 5B provide a reduced neighbor effect compared to conventional programming techniques. This allows a memory system according to an embodiment to be designed for a narrower range of thresholds for each level, and increases the margins (read windows) between the threshold levels.

Figure 6:
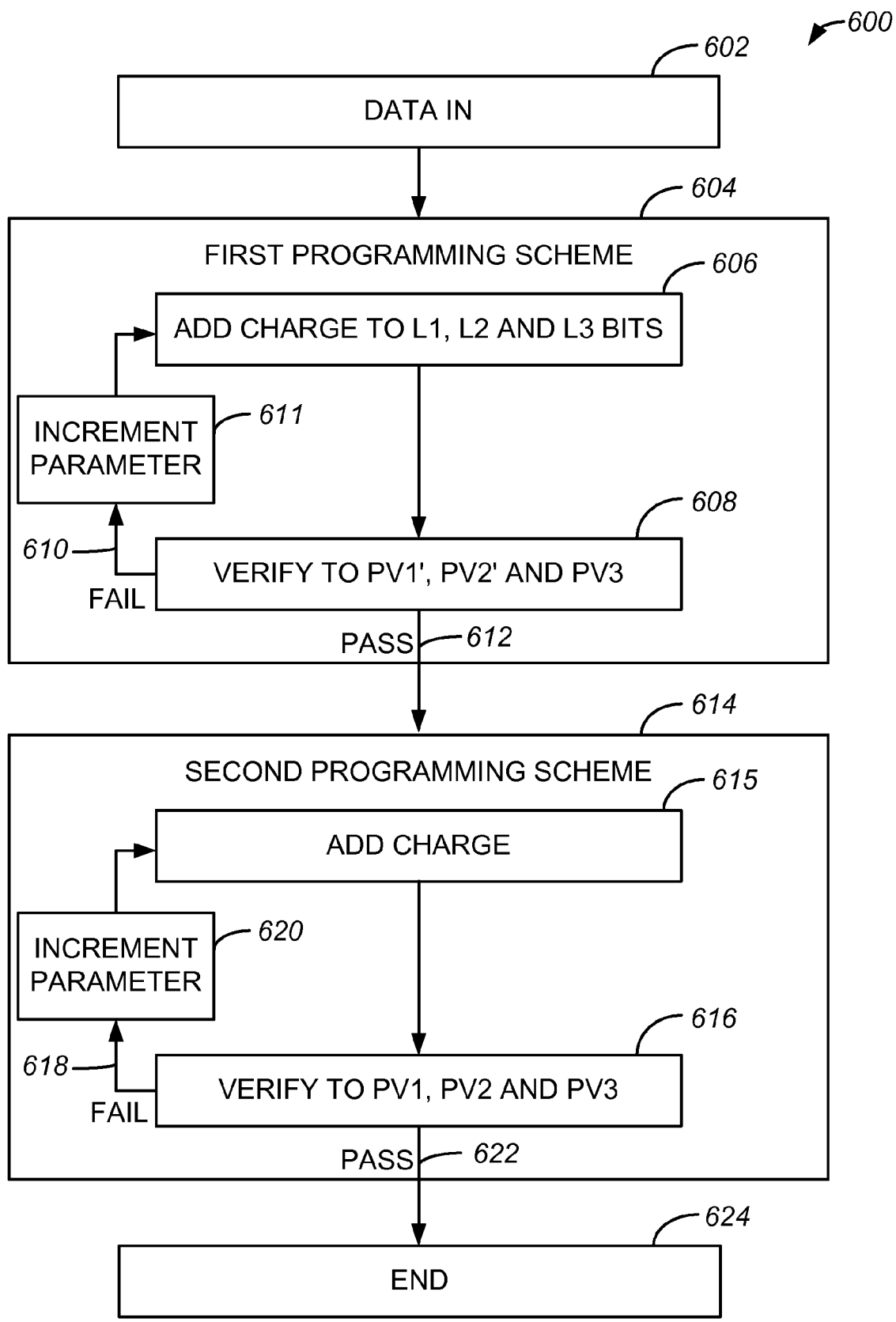
FIG. 6 is a flow chart of a method of operating a two-sided charge-trapping memory device according to an embodiment.

FIG. 6 is a flow chart of a method 600 of operating a two-sided charge-trapping memory array according to an embodiment. Data is input to the charge-trapping memory array (step 602). Charge-trapping sites on one side of two-sided charge-trapping cells of the memory array are programmed using a first programming scheme (step 604). Programming the sites involves adding charge to a charge-trapping site of the charge-trapping layer of the two-sided charge-trapping cell (e.g. the right 110 or left 108 charge-trapping site of FIG. 1A). In a particular embodiment, the charge-trapping sites are the first-programmed sites of the two-sided charge-trapping cells. In an alternative embodiment, the charge-trapping sites are the second-programmed sites of the two-sided charge-trapping cells.

A first plurality of charge-trapping sites of the two-sided charge-trapping cells are programmed to a first preliminary programming level (e.g. PV1'), a second plurality of charge-trapping sites of the two-sided charge-trapping cells are programmed to a second preliminary programming level (e.g. PV2'), and a third plurality of charge-trapping sites of the two-sided charge-trapping cells are programmed to a final programming level (e.g. PV3), where the final programming level is higher than the second preliminary programming level, which is higher than the first preliminary programming level.

In a particular embodiment the first programming scheme 604 includes coupling a charge pulse to the level 1, level 2 and level 3 sites (step 606), verifying the programming level (e.g. to PV1', PV2', and PV3) (step 608), and repeating steps 606 and 608 (branch 610) until the sites pass verification (branch 612). In other words, the cell/site is evaluated against a program-verify level after each pulse. A bias parameter, such as the bit line voltages to the charge-trapping cells/sites that are being programmed, is incremented (step 611) between charge pulses. If a charge-trapping site passes program verification, that cell/site is deselected and further charge is not added in the first programming scheme.

Then, a second programming scheme (step 614) is used to program the sites of the two-sided charge-trapping cells. The first plurality of charge-trapping sites of the two-sided charge-trapping cells are programmed to a first final programming level (e.g. PV1) and the second plurality of charge-trapping sites of the two-sided charge-trapping cells are programmed to a second final programming level (e.g. PV2).

Charge is added (step 615) to the first, second, and third pluralities of charge-trapping sites. Adding charge to the first and second pluralities of charge-trapping sites increases the Vt levels from the PV1' and PV2' levels obtained in the first programming scheme 604 toward the final programming-verify levels. The third plurality of charge-trapping sites was programmed to the PV3 level in the first programming scheme. The first charge pulse of the second programming scheme (step 614) adds negligible charge to these sites because the higher a charge-rapping site is programmed, the less charge is transferred during each pulse. Any additional charge on the L3 sites increases the Vt, which does not degrade operation of the memory device because the L3 sites are the highest. There is no read window above the L3 Vt distribution. Any incidental additional charge on the L3 sites actually increases the read window between the L2 Vt distribution and the L3 Vt distribution.

The programming levels of the first, second and third pluralities of charge-trapping sites of the two-sided charge-trapping cells are verified to the first final programming level, the second final programming level, and the third final programming level (step 616). The L3 sites are verified to the PV3 level because many factors in an IC can affect the Vt level of a site. If any of the charge trapping sites are insufficiently programmed (branch 618), a bias condition or parameter, such as word line voltage, is incremented (step 620) and additional charge is added to those site. In most cases, no additional charge is required to be added to the level 3 sites, since the level 3 sites were verified to the final programming level PV3 during the first programming scheme (step 604). If a charge-trapping site passes verification (branch 622), that site is masked. After the charge-trapping sites are programmed and verified, the process ends (step 624).

In an alternative embodiment the first, second, and third plurality of charge-trapping sites are verified to their respective final levels, and if they pass are deactivated (masked). If they fail verification, then a bias parameter, such as a word line voltages is incremented and additional charge is added to those sites. This is repeated until all sites pass verification.

Programming the level 3 sites to the final third programming level during the first programming scheme of a two-programming scheme method of operating a charge-trapping MLC memory array with two-sided charge-trapping cells reduces the neighbor effect and tightens the Vt (programming) distribution. Wider READ windows are achieved because of the reduced neighbor effect, improving the operation of the memory device.

Figure 7A:
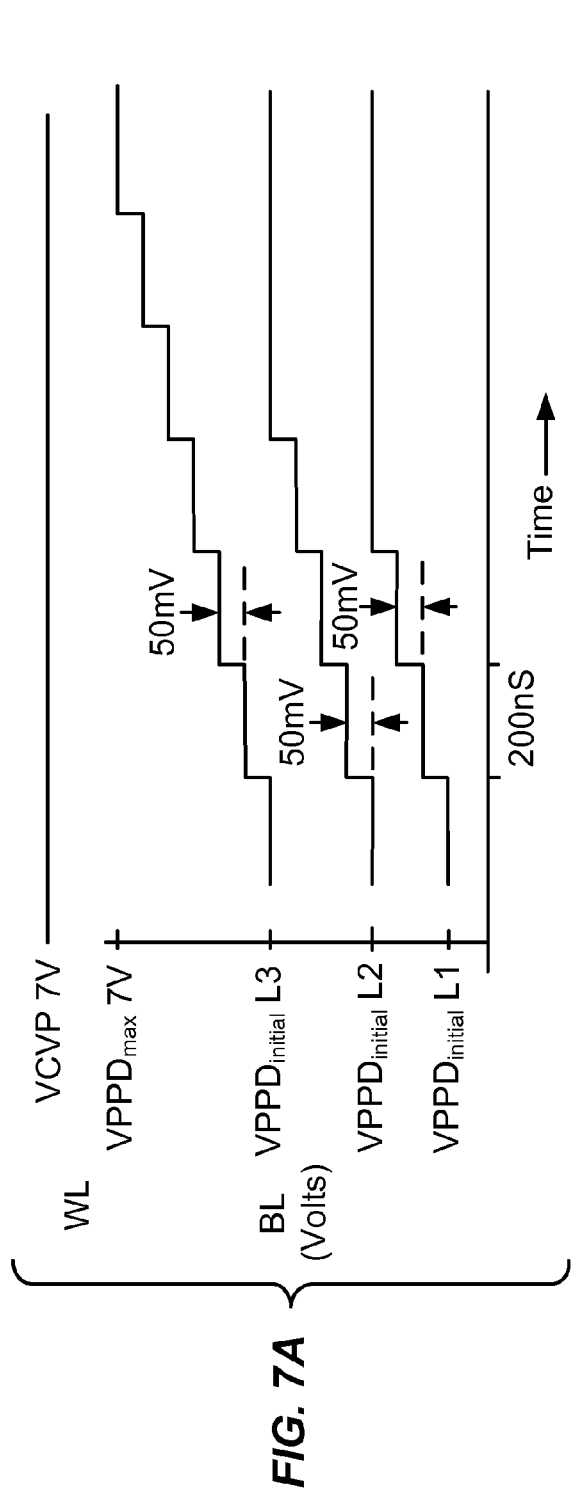
FIG. 7A is a timing diagram of a first programming scheme used in an embodiment.

FIG. 7A is a timing diagram of an exemplary first programming scheme used in an embodiment. A word line voltage (WL) is set to an initial value (e.g. 7 V) and held constant during the first programming scheme. The bit line (BL) voltages (VPPDs) of the two-sided charge-trapping cells are stepped from initial levels in fixed increments. In a particular embodiment, the bit lines are stepped in 50 mV increments every 200 nano-seconds.

Each step (increment) in the bit line voltage produces a charge pulse. The charge-trapping site is checked against a programming verify value between each charge pulse. A charge-trapping site being programmed to the first level is checked against a first preliminary level (e.g. PV1'), a charge-trapping site being programmed to the second level is checked against a second preliminary level (e.g. PV2'), and a charge-trapping site being programmed to the third level is checked against a third final level (e.g. PV3). The initial levels $LV1_0$, $LV2_0$, $LV3_0$ depend on the data value being programmed to the charge-trapping site of the two-sided charge-trapping cells. For example, if the charge-trapping site is to be programmed to the first level, the bit line for that charge-trapping site starts at $LV1_0$. The charge-trapping sites of several two-sided charge-trapping memory are programmed in parallel, however, only one side of any cell is programmed at a time. That is, every 200 nS the bit line voltage levels (VPPDs) to the L1, L2, and L3 sites of one-half of the two-sided charge-trapping cells are stepped 50 mV (to a maximum $VPPD_{max}$ (e.g. 7 V)) and checked against the appropriate program-verify level. If a charge-trapping site passes program-verify, its bit line is de-selected (masked) and that site is no longer programmed. Other charge-trapping sites continue to be programmed until all sites are programmed to the desired levels or the programming process fails.

Figure 7B:
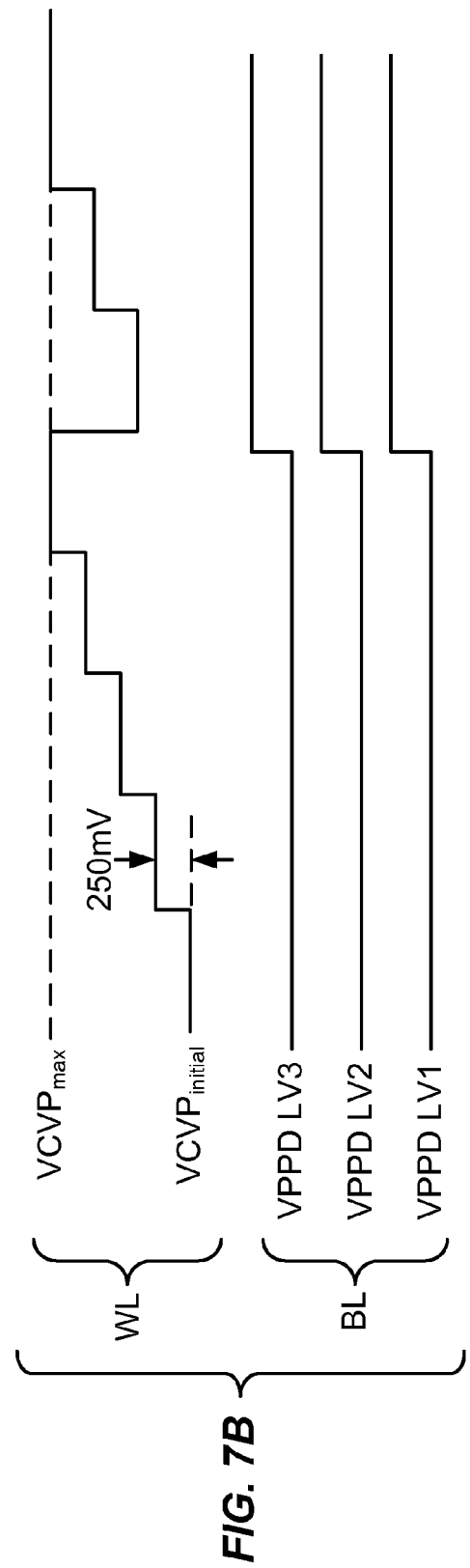
FIG. 7B is a timing diagram of a second programming scheme used in an embodiment.

FIG. 7B is a timing diagram of a second programming scheme used in an embodiment. The bit line (drain) voltages of one side of a two-sided charge-trapping cell are set to a level selected according to the first programming scheme. In a particular embodiment, the bit line voltages for charge-trapping sites being programmed to a common level are set to the final bit line voltage obtained at the completion of the first programming scheme minus 200 mV. This avoids over-charging the site. In the event of L3 sites, reducing the voltage on the first pulse, if applied before PV3 verification (masking), reduces any charge transferred to the L3 sites to a negligible amount. For example, the bit lines of the L3 sites will be set to an LV3 level, the bit lines of the L2 sites will be set to an LV2 level, and the bit lines of the L1 sites will be set to an LV1 level, where LV3 is greater than LV2, which is greater than LV1.

The bit line voltages of the different levels are held constant while the word line voltages are stepped. In a particular example, the word lines are stepped from a $VCVP_{initial}$ value to a $VCVP_{Max}$ value in 250 mV steps. If a charge-trapping Vt level does not pass program-verify when the word line reaches the maximum allowed voltage, the bit line(s) is stepped, and the word lines are again stepped from $VCVP_{initial}$.

In the second programming scheme, a first final programming level (PV1) is used to verify that the level 1 charge-trapping sites have been properly programmed, a second final programming level (PV2) is used to verify that the level 2 charge-trapping sites have been properly programmed, and the final third programming level (PV3) is used to verify that the level 3 sites retain the level 3 programming they received in the first programming scheme. That is, the program-verify level for the L3 sites used in the second programming scheme (PV3) is the same as the program-verify level for the L3 sites used in the first programming scheme (also PV3), and that this level is a final programming level. As discussed in reference to FIG. 6, while the L3 sites generally do not need further programming in the second programming scheme, a further embodiment includes adding additional charge to the L3 sites during the second programming scheme if the L3 sites do not pass PV3.

Figure 8:
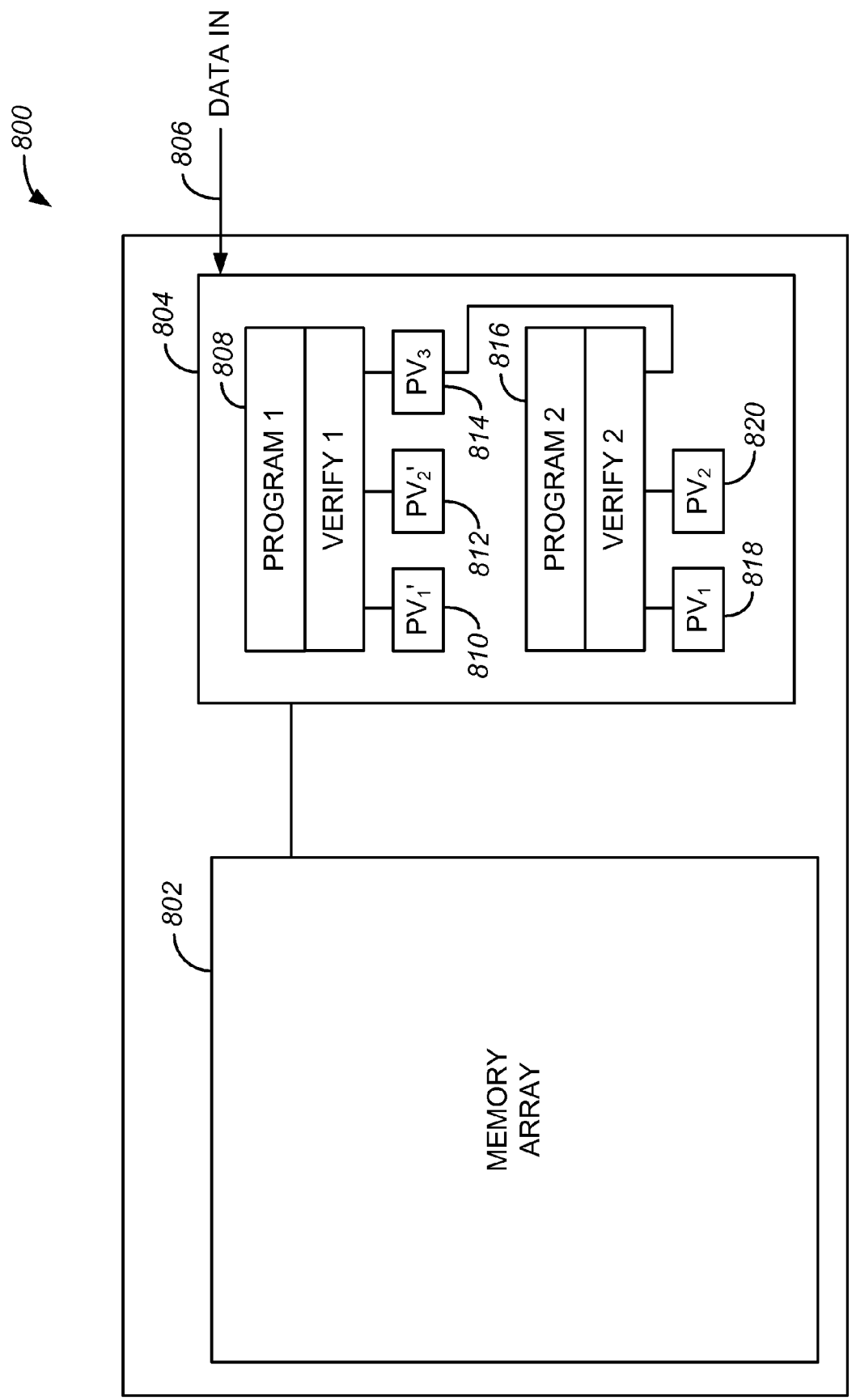
FIG. 8 is a diagram of an integrated circuit according to an embodiment of the invention.

FIG. 8 is a diagram of an integrated circuit ("IC") 800 according to an embodiment of the invention. The IC has a memory array 802 of two-sided charge-trapping cells (not individually shown, see FIG. 1A). The memory array 802 optionally includes other types of memory cells. The IC also includes control logic 804 configured to program charge-trapping cites of the memory array 802 to selected levels according to data received at a data input 806.

The control logic 804 includes first program-verify logic 808 configured to selectively program charge trapping sites in the memory array 802 using a first programming scheme (e.g., see FIG. 6, ref. num. 604; FIG. 7A) according to data received at the data input 806. In an exemplary application, charge-trapping sites store charge indicating one of four logic levels, L0, L1, L2, L3, where L0 is an erased level, and L1, L2, L3 indicate increasing amounts of charge being transferred to the charge-trapping site. The first program-verify logic 808 operates in conjunction with stored values PV1', PV2', and PV3 in data storage sites 810, 812, 814, where PV1' is a preliminary first program-verify level (e.g., for L1 charge-trapping sites), PV2' is a preliminary second program-verify level (e.g., for L2 charge-trapping sites), and PV3 is a final program-verify level (e.g., for L3 charge-trapping sites) using a first programming scheme. The data storage sites 810, 812, 814 (and 818, 820, below) are shown as being within the control logic 804, but could be elsewhere on the IC 800, or even off-chip.

After the control logic 804 has performed the first program-verify logic 808 to program L1, L2, and L3 charge-trapping sites in the memory array 802 to PV1', PV2, and PV3 levels, respectively, the control logic 804 performs second program-verify logic 816. The second program-verify logic 816 operates in conjunction with stored values PV1 and PV2 stored in data storage sites 818, 820; where PV1 is a final first program-verify level (e.g., for the L1 charge-trapping sites) and PV2 is a final second program-verify level (e.g., for the L2 charge-trapping sites), and the stored value PV3 stored in data storage site 814. That is, the first program-verify logic 808 uses the final L3 program-verify value PV3, and the second program-verify logic 816 also uses the final L3 program-verify value PV3 to program the charge-storage sites of the memory array 802 to the desired levels (data values) using a second programming scheme.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

What is claimed is:

1. A method for operating a selected cell in an array of charge-trapping cells, wherein the selected cell includes first and second charge trapping sites programmable to different threshold voltages, including a lower level threshold and a higher level threshold, which represent programmed states, comprising:

programming the first charge trapping site in the selected cell to a programmed state corresponding to the lower level threshold voltage range, said programming includes applying a first programming scheme adapted to setting a threshold voltage for the first charge trapping site at a level below the lower level threshold voltage range, and applying a second programming scheme adapted to setting the threshold voltage for the first charge trapping site within the lower level threshold voltage range; and programming the second charge trapping site in the selected cell to a programmed state corresponding to the higher level threshold voltage range, said programming includes applying a first programming scheme adapted to setting a threshold voltage for the second charge trapping site within the higher level threshold voltage range.

2. The method of claim 1, including after applying the first programming scheme to the second charge trapping site, determining whether the threshold voltage for the second charge trapping site is within the higher level threshold voltage range, and if not, then applying the second programming scheme adapted to setting the threshold voltage for the second charge trapping site within the higher level threshold voltage range.

3. The method of claim 1 including programming the second charge trapping site in the selected cell before programming the first charge trapping site.

4. The method of claim 1, wherein the first programming scheme applied for programming the first and second charge trapping site include applying pulse according to a first program biasing arrangement to shift the threshold voltage of a selected charge trapping site, and determining whether the level of the threshold voltage satisfies a first program verify target, and if not, then iteratively retrying applying a pulse and determining until the threshold voltage of a selected charge trapping site satisfies the first program verify target, or a maximum number or retries is reached; and further wherein the first programming scheme is adapted for programming the first charge trapping site by setting the first program verify target at a value below the lower level threshold voltage range, and the first programming scheme applied for programming the second charge trapping site is adapted for programming the second charge trapping site by setting the first program verify target at a value within the higher level threshold voltage range.

5. The method of claim 4, wherein the first biasing arrangement of first programming scheme comprises holding a word line voltage constant and stepping a first bit line voltage during successive iterations of the retrying.

6. The method of claim 1, wherein the second programming scheme includes applying pulse according to a second program biasing arrangement to shift the threshold voltage of a selected charge trapping site, and determining whether the level of the threshold voltage satisfies a second program verify target, and if not, then iteratively retrying applying a pulse and determining until the threshold voltage of a selected charge trapping site satisfies the second program verify target, or a maximum number of retries is reached; and further wherein the second programming scheme is adapted for programming the first charge trapping site by setting the second program verify target at a value within the lower level threshold voltage range.

7. The method of claim 6, wherein the second biasing arrangement of second programming scheme comprises holding a bit line voltage constant and stepping a word line voltage during successive iterations of the retrying.

8. The method of claim 2, wherein the second programming scheme include applying pulse according to a second program biasing arrangement to shift the threshold voltage of a selected charge trapping site, and determining whether the level of the threshold voltage satisfies a second program verify target, and if not, then iteratively retrying applying a pulse and determining until the threshold voltage of a selected charge trapping site satisfies the second program verify target, or a maximum number of retries is reached; and further wherein the second programming scheme is adapted for programming the first charge trapping site by setting the second program verify target at a value within the lower level threshold voltage range, and the second programming scheme is adapted for programming the second charge trapping site by setting the second program verify target at a value within the higher level threshold voltage range.

9. The method of claim 1, wherein the first and second charge trapping sites are programmable to at least four levels, including a first lowest threshold state, second and third intermediate threshold states and a fourth highest threshold state, and wherein said lower threshold corresponds with one of the second and third intermediate threshold states and said higher threshold corresponds with the fourth highest threshold state.

10. An integrated circuit comprising:

a memory array including two-sided charge-trapping memory cells having respective first and second charge-trapping sites programmable to different threshold voltages, including a lower level threshold range and a higher level threshold range which represent programmed states;

a biasing circuitry coupled to the memory array to apply biasing arrangements for programming the selected cell; and a control logic for operating the biasing circuitry for programming a selected cell in the memory array, the control logic including logic to program the first charge trapping site in the selected cell to a programmed state corresponding to the lower level threshold voltage range, by applying a first programming scheme adapted to setting a threshold voltage for the first charge trapping site at a value below the lower level threshold voltage range, and applying a second programming scheme adapted to setting the threshold voltage for the first charge trapping site at a value within the lower level threshold voltage range; and logic to program the second charge trapping site in the selected cell to a programmed state corresponding to the higher level threshold voltage range, by applying a first programming scheme adapted to setting a threshold voltage for the second charge trapping site at a value within the higher level threshold voltage range.

11. The integrated circuit of claim 10, wherein the control logic includes logic operated after programming the second charge trapping site by applying a first programming scheme, which determines whether the threshold voltage for the second charge trapping site is within the higher level threshold voltage range, and if not, then applies the second programming scheme adapted to setting the threshold voltage for the selected cell within the higher level threshold voltage range.

12. The integrated circuit of claim 10, wherein the control logic is configured to program the second charge trapping site in the selected cell before programming the first charge trapping site.

13. The integrated circuit of claim 10, wherein the first programming scheme applied for programming the second charge trapping site utilize an iterative procedure, where an iteration in the iterative procedure includes applying a pulse according to a first program biasing arrangement to shift the threshold voltage of a selected charge trapping site, and determining whether the level of the threshold voltage satisfies a first program verify target, executed until the threshold voltage of a selected charge trapping site satisfies the first program verify target, or a maximum number of retries is reached; and further wherein the first programming scheme is adapted for programming the first charge trapping site by setting the first program verify target at a value below the lower level threshold voltage range, and the first programming scheme applied for programming the second charge trapping site is adapted for programming the second charge trapping site by setting the first program verify target at a value within the higher level threshold voltage range.

14. The integrated circuit of claim 13, wherein the first biasing arrangement of first programming scheme comprises holding a word line voltage constant and stepping a first bit line voltage during successive iterations.

15. The integrated circuit of claim 10, wherein the second programming scheme is an iterative procedure, where an iteration in the iterative procedure includes applying a pulse according to a second program biasing arrangement to shift the threshold voltage of a selected charge trapping site, and determining whether the level of the threshold voltage satisfies a second program verify target, executed until the threshold voltage of a selected charge trapping site satisfies the second program verify target, or a maximum number of retries is reached; and further wherein the second programming scheme is adapted for programming the first charge trapping site by setting the second program verify target at a value within the lower level threshold voltage range.

16. The integrated circuit of claim 15, wherein the second program biasing arrangement of the second programming scheme comprises holding a bit line voltage constant and stepping a word line voltage during successive iterations.

17. The method of claim 11, wherein the second programming scheme utilize an iterative procedure, where an iteration in the iterative procedure includes applying a pulse according to a second program biasing arrangement to shift the threshold voltage of a selected charge trapping site, and determining whether the level of the threshold voltage satisfies a second program verify target, executed until the threshold voltage of a selected charge trapping site satisfies the second program verify target, or a maximum number of retries is reached; and further wherein the second programming scheme is adapted for programming the first charge trapping site by setting the second program verify target at a value within the lower level threshold voltage range, and the second programming scheme is adapted for programming the second charge trapping site by setting the second program verify target at a value within the higher level threshold voltage range.

18. The integrated circuit of claim 10, wherein the first and second charge trapping sites are programmable to at least four levels, including a first lowest threshold state, second and third intermediate threshold states and a fourth highest threshold state, and wherein said lower threshold state is one of the second and third intermediate threshold states and said higher threshold state is the fourth highest threshold state.

* * * * *